United States Patent
Holma et al.

(10) Patent No.: US 10,201,095 B2
(45) Date of Patent: Feb. 5, 2019

(54) METHOD FOR MANUFACTURING A CIRCUIT BOARD SYSTEM WITH MECHANICAL PROTECTION

(71) Applicant: TELLABS OY, Espoo (FI)

(72) Inventors: Antti Holma, Espoo (FI); Peter Kokko, Espoo (FI)

(73) Assignee: CORIANT OY, Espoo (FI)

( * ) Notice: Subject to any disclaimer, the term of this patent is extended or adjusted under 35 U.S.C. 154(b) by 444 days.

(21) Appl. No.: 14/715,627

(22) Filed: May 19, 2015

(65) Prior Publication Data

US 2015/0250059 A1    Sep. 3, 2015

Related U.S. Application Data

(62) Division of application No. 13/915,644, filed on Jun. 12, 2013, now abandoned.

(30) Foreign Application Priority Data

Jun. 26, 2012 (FI) ...................................... 20125725

(51) Int. Cl.
*H05K 3/30* (2006.01)
*H05K 1/02* (2006.01)
*H05K 3/22* (2006.01)

(52) U.S. Cl.
CPC .............. *H05K 3/303* (2013.01); *H05K 1/02* (2013.01); *H05K 3/22* (2013.01); *H05K 3/222* (2013.01);
(Continued)

(58) Field of Classification Search
CPC ...... H05K 13/0465; H05K 1/024; H05K 3/22; H05K 3/303; H05K 3/30; H05K 3/3484;
(Continued)

(56) References Cited

U.S. PATENT DOCUMENTS 4,541,893 A * 9/1985 Knight .............. H01L 21/76885
204/192.35
6,495,406 B1 * 12/2002 Honeycutt ........ H01L 21/28044
257/E21.198
(Continued)

FOREIGN PATENT DOCUMENTS

JP        2009239109       10/2009
JP        20100212542       9/2010

OTHER PUBLICATIONS

European Search Report, dated Nov. 1, 2013, from corresponding EP application.
(Continued)

*Primary Examiner* — Paul D Kim
(74) *Attorney, Agent, or Firm* — Young & Thompson

(57) ABSTRACT

A method for manufacturing a circuit board system comprising mechanical protection of electrical components is presented. The circuit board system comprises a circuit board (101) furnished with electrical components (103-111) and a protection element (102) attached to areas of the circuit board which are free from the electrical components. The protection element has thickness in the direction perpendicular to the circuit board and it is shaped to leave the electrical components unscreened in the direction perpendicular to the circuit board. Thus, the protection element constitutes barriers protecting the electrical components but still allows the electrical components to be accessed from the direction perpendicular to the circuit board for example in a flying probe testing. Furthermore, the protection element provides electrical connections between functional entities of the circuit board system.

4 Claims, 5 Drawing Sheets

(52) U.S. Cl.
CPC ............... *H05K 3/30* (2013.01); *H05K 3/306* (2013.01); *H05K 2201/09972* (2013.01); *H05K 2201/1059* (2013.01); *H05K 2201/10189* (2013.01); *H05K 2201/10303* (2013.01); *H05K 2201/10363* (2013.01); *H05K 2201/2018* (2013.01); *H05K 2203/162* (2013.01); *Y10T 29/49004* (2015.01); *Y10T 29/4913* (2015.01)

(58) Field of Classification Search
CPC . H05K 2201/10371; H05K 2203/1572; H05K 1/0203; H05K 1/0204; H01L 2224/16225; H01L 2924/19105; H01L 23/42; H01L 21/4853; H01L 23/552
See application file for complete search history.

(56) References Cited

U.S. PATENT DOCUMENTS

| | | | | |
|---|---|---|---|---|
| 6,803,304 | B2 * | 10/2004 | Asami | H01L 21/76807 257/E21.508 |
| 7,161,091 | B1 * | 1/2007 | Kiishinen | H05K 9/0028 174/377 |
| 7,262,369 | B1 * | 8/2007 | English | H01L 23/04 174/370 |
| 7,292,459 | B2 * | 11/2007 | Wang | H05K 9/0032 174/352 |
| 7,452,213 | B2 * | 11/2008 | Herdendorf | G01R 1/0735 439/67 |
| 8,097,489 | B2 * | 1/2012 | Pagaila | H01L 21/561 438/106 |
| 8,581,109 | B2 * | 11/2013 | Tuominen | H01L 21/4846 174/260 |
| 8,850,226 | B2 * | 9/2014 | Falk | G01R 31/00 713/189 |
| 2004/0113708 | A1 | 6/2004 | Takanashi et al. | |
| 2006/0154499 | A1 | 7/2006 | Naito et al. | |
| 2007/0086149 | A1 | 4/2007 | Choi et al. | |
| 2008/0179731 | A1 | 7/2008 | Fan et al. | |
| 2009/0067140 | A1 | 3/2009 | Lynch et al. | |
| 2009/0116201 | A1 | 5/2009 | Hsieh | |
| 2009/0215287 | A1 | 8/2009 | Mori et al. | |
| 2009/0268423 | A1 | 10/2009 | Sakurai et al. | |

OTHER PUBLICATIONS

Finnish Search Report dated Apr. 15, 2013, corresponding to the Foreign Priority Application No. 20125725.

* cited by examiner

A - A

METHOD FOR MANUFACTURING A CIRCUIT BOARD SYSTEM WITH MECHANICAL PROTECTION

This is a division of application Ser. No. 13/915,644 filed on Jun. 12, 2013, now abandoned.

FIELD OF THE INVENTION

The invention relates to a method for manufacturing a circuit board system comprising mechanical protection of electrical components.

BACKGROUND

A typical circuit board system comprises a circuit board furnished with electrical components. The circuit board comprises a body made of one or more layers of electrically insulating material and electrical conductors on one or both of the surfaces of the circuit board and/or between the layers of the electrically insulating material. Each of the electrical components can be, for example, an integrated circuit such as a processor or a memory, or a discrete component such as a resistor, a capacitor, an inductor, a transistor, or a diode.

A circuit board system can be subjected to damaging mechanical impacts in many situations. For example, the circuit board system can be a part of a plug-in unit where the circuit board constitutes a body of the plug-in unit and where edges of the circuit board slide in corresponding support elements of a frame or another device for receiving the plug-in unit when the plug-in unit is being installed. If the plug-in unit is being pushed into the frame or the other device in a glancing or otherwise wrong direction, the electrical components of the circuit board system may hit to neighboring plug-in units and/or to structures of the device receiving the plug-in unit.

A known arrangement for protecting electrical components against mechanical impacts comprises a shield plate which is parallel to a circuit board and which is installed to the circuit board with spacers so that there is room for electrical components between the circuit board and the shield plate. An inconveniency related to this protection arrangement is unsuitability for applications where the circuit board system has to be as thin as possible in the direction perpendicular to the circuit board. Furthermore, different thermal expansion coefficients of the circuit board and the shield plate may cause mechanical stresses and/or deformations in the circuit board system.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the invention, there is provided a new method for manufacturing a circuit board system that can be, for example but not necessarily, a part of a telecommunication equipment.

A circuit board system obtainable by a method according to the invention comprises:

a circuit board furnished with electrical components on a surface of the circuit board, and at least one protection element attached to areas of the surface of the circuit board which are free from the electrical components, the protection element having thickness in a direction perpendicular to the circuit board and width and length in directions parallel with the circuit board, the protection element being shaped to leave the electrical components unscreened in the direction perpendicular to the circuit board and the width of the protection element being greater than the thickness of the protection element, wherein the protection element comprises electrically conductive parts connected to electrically conductive parts of the circuit board and providing at least one galvanic connection between a first functional entity of the circuit board system and a second functional entity of the circuit board system.

The protection element is shaped to leave the electrical components unscreened in the direction perpendicular to the circuit board. Thus, the protection element allows the electrical components to be accessed from the direction perpendicular to the circuit board for example in a flying probe "FP" testing. Furthermore, the protection element does not excessively hinder the cooling of the electrical components because the electrical components are unscreened in the direction perpendicular to the circuit board. Furthermore, the protection element does not increase the thickness of the circuit board system in the direction perpendicular to the circuit board if the thickness of the protection element is at most the maximum of the heights of all components on the surface of the circuit board, where the heights are measured from the surface of the circuit board. Also in this case, the protection element is capable of protecting the components against mechanical impacts in directions parallel to the circuit board and in directions having a slight angle with respect to the surface of the circuit board. The thickness of the protection element is advantageously, but not necessarily, greater than the maximum of the heights of the electrical components to be protected and lower than the maximum of the heights of all components on the surface of the circuit board. If the thickness of the protection element is greater than the maximum of the heights of the electrical components to be protected, the protection element is capable of protecting these electrical components in a situation in which the circuit board is being pressed against a wide flat surface.

In a circuit board system obtainable by a method according to an advantageous, exemplifying embodiment of the invention, the body of the protection element is made of same material as the electrically insulating body of the circuit board so as to make the thermal expansion coefficient of the protection element to be substantially the same as that of the circuit board. In a circuit board system obtainable by a method according to another advantageous, exemplifying embodiment of the invention, the protection element comprises rubber so as to make the protection element flexible and thereby capable of adapting to the thermal expansion of the circuit board.

The method according to the invention for manufacturing the above-described circuit board system comprises:

furnishing the circuit board with the electrical components onto the surface of the circuit board, and attaching the at least one protection element to areas of the surface of the circuit board which are free from the electrical components, the protection element having the thickness in the direction perpendicular to the circuit board and the width and the length in the directions parallel with the circuit board, the protection element being shaped to leave the electrical components unscreened in the direction perpendicular to the circuit board and the width of the protection element being greater than the thickness of the protection element, wherein the attaching the at least one protection element to the areas of the surface of the circuit board comprises providing, with the aid of the protection element, the at least one galvanic connection between the first and second functional entities of the circuit board system, the first functional entity comprising the first ones of the electrical components and the second functional entity comprising the second ones of the electrical components.

A method according to an advantageous, exemplifying embodiment of the invention comprises the following actions after the furnishing of the circuit board with the electrical components:

testing a first functional entity comprising first ones of the electrical components, testing a second functional entity comprising second ones of the electrical components, the first and second functional entities being tested separately from each other, providing, with the aid of the protection element, at least one galvanic connection between the first and second functional entities when the protection element is attached to the areas of the surface of the circuit board, and testing functionality of the circuit board system so that the first and second functional entities are co-operating with each other via the at least one galvanic connection during the testing of the functionality.

The above-mentioned first functional entity can be, for example but not necessarily, a power supply converter of the circuit board system. The above-mentioned second functional entity can be, for example but not necessarily, a signal processing part of the circuit board system.

A number of non-limiting exemplifying embodiments of the invention are described in accompanied dependent claims.

Various non-limiting exemplifying embodiments of the invention both as to constructions and to methods of operation, together with additional objects and advantages thereof, will be best understood from the following description of specific exemplifying embodiments when read in connection with the accompanying drawings.

The verbs "to comprise" and "to include" are used in this document as open limitations that neither exclude nor require the existence of unrecited features. The features recited in depending claims are mutually freely combinable unless otherwise explicitly stated.

BRIEF DESCRIPTION OF THE FIGURES

The exemplifying embodiments of the invention and their advantages are explained in greater detail below in the sense of examples and with reference to the accompanying drawings, in which:

FIG. 3b shows a schematic view of a section taken along the line A-A shown in FIG. 3a.

DESCRIPTION OF THE EXEMPLIFYING EMBODIMENTS

Figure 1A:
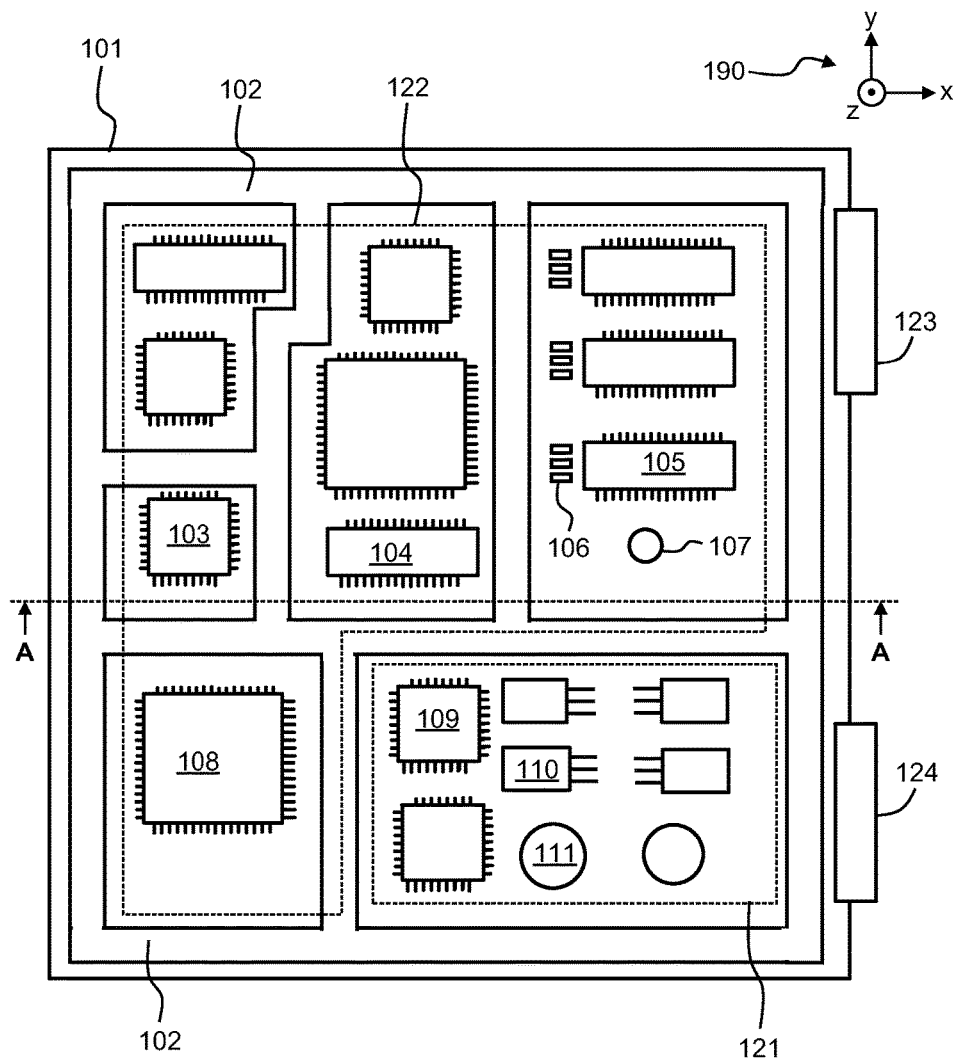
FIG. 1a illustrates a circuit board system obtainable by a method according to an exemplifying embodiment of the invention.
Figure 1B:
FIG. 1b shows a schematic view of a section taken along the line A-A shown in FIG. 1a, FIG. 2 shows a schematic view of a section taken from a detail of a circuit board system obtainable by a method according to an exemplifying embodiment of the invention.

FIG. 1a illustrates a circuit board system obtainable by a method according to an exemplifying embodiment of the invention. FIG. 1b shows a schematic view of a section taken along the line A-A shown in FIG. 1a. The circuit board system comprises a circuit board 101 furnished with electrical components some of which are denoted with reference numbers 103, 104, 105, 106, 107, 108, 109, 110, and 111. In the exemplifying case illustrated in FIGS. 1a and 1b, the circuit board system comprises electrical connectors 123 and 124. The circuit board system can be, for example, a plug-in unit which is installed by pushing it in the x-direction of a coordinate system 190 into a device for receiving the plug-in unit. The circuit board 101 comprises a body made of one or more layers of electrically insulating material and electrical conductors on one or both of the surfaces of the circuit board and/or between the layers of the electrically insulating material. Each of the electrical components can be an integrated circuit such as a processor or a memory, or a discrete component such as a resistor, a capacitor, an inductor, a transistor, or a diode. In the exemplifying case illustrated in FIGS. 1a and 1b, the electrical components 103, 104, 105, 108, and 109 are integrated circuits and the electrical components 106, 107, 110, and 111 are discrete components.

The circuit board system comprises a protection element 102 attached to areas of the surface of the circuit board 101 which are free from the electrical components. In the exemplifying case illustrated in FIGS. 1a and 1b, the protection element 102 has a netlike structure so that the protection element comprises openings for the electrical components. Therefore, protection element 102 is shaped to leave the electrical components unscreened in the direction perpendicular to the circuit board, i.e. in the z-direction of the coordinate system 190. Thus, the protection element allows the electrical components to be accessed from the direction perpendicular to the circuit board for example in a flying probe "FP" testing.

The protection element 102 has thickness in the direction perpendicular to the circuit board 101, i.e. in the z-direction of the coordinate system 190. Thus, the protection element 102 forms barriers capable of protecting the electrical components against mechanical impacts in directions parallel to the circuit board, i.e. in the xy-plane of to coordinate system 190, and in directions having a slight angle with respect to the surface of the circuit board. As can be seen from FIG. 1b, the protection element 101 does not increase the thickness of the circuit board system in the direction perpendicular to the circuit board if the thickness of the protection element is at most the maximum of the heights of the electrical components, where the heights are measured from the surface of the circuit board.

In a circuit board system obtainable by a method according to an exemplifying embodiment of the invention, the body of the protection element 102 is made of the same material as the electrically insulating body of the circuit board 101 so as to make the thermal expansion coefficient of the protection element to be substantially the same as that of the circuit board. The protection element can be attached to the circuit board 101, for example, using glue, screws, solder between surfaces of the circuit board and the protection element, press-fit "PF" or soldered pins in mutually corresponding holes of the circuit board and the protection element, and/or plugs shaped so that they provide form locking with edges of holes of the circuit board.

In a circuit board system obtainable by a method according to another exemplifying embodiment of the invention, the protection element 102 comprises rubber so as to make the protection element flexible and thereby capable of adapting to the thermal expansion of the circuit board. The protection element 102 can be attached to the circuit board 101, for example, using glue. A protection element having a glue-surface is straightforward to attach to the circuit board. It can be attached to the circuit board in any of various manufacturing phases, or even in enduser's premises. In addition or alternatively, the protection element may comprise, for example, plugs that are pushed to holes of the circuit board in order to attach the protection element to the circuit board. The plugs are advantageously shaped so that they provide form locking with the edges of the holes of the circuit board. The plugs can be a same piece with the protection element.

In a circuit board system obtainable by a method according to an exemplifying embodiment of the invention, the protection element 102 comprises electrically conductive parts connected to corresponding electrically conductive parts of the circuit board and providing at least one galvanic connection between a first functional entity 121 of the circuit board system and a second functional entity 122 of the circuit board system. The first functional entity 121 can be, for example but not necessarily, a DC-to-DC or AC-to-DC power supply converter of the circuit board system and the second functional entity 122 can be, for example but not necessarily, a signal processing part of the circuit board system. For another example, the first functional entity 121 can be an analogue signal processing part of the circuit board system and the second functional entity 122 can be a digital signal processing part of the circuit board system. For still one example, the first functional entity 121 can be an equalizer of a digital signal processing part of the circuit board system and the second functional entity 122 can be a detector of the digital signal processing part.

The circuit board system can be, for example but not necessarily, a part of a telecommunication device, wherein the signal processing part of the circuit board system may comprise a processing system for supporting one or more data transfer protocols such as, for example, Internet Protocol "IP", Ethernet protocol, MultiProtocol Label Switching "MPLS" protocol, and Asynchronous Transfer Mode "ATM". The above-described arrangement, where the protection element 102 connects the functional entities 121 and 122 to each other, allows the functional entities to be tested separately prior to installing the protection element, and subsequent installation of the protection element makes the circuit board system ready for functional testing where the functional entities 121 and 122 are co-operating with each other.

Figure 2:
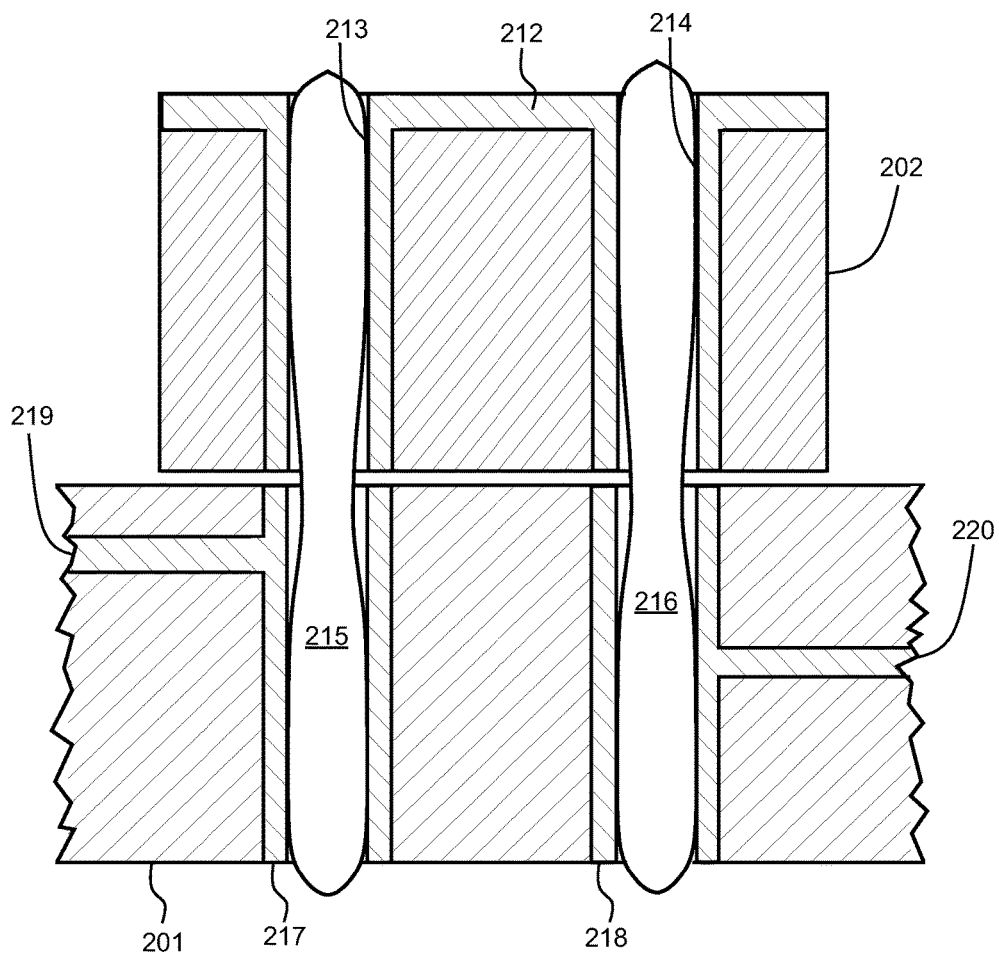

FIG. 2 shows a schematic view of a section taken from a detail of a circuit board system obtainable by a method according to an exemplifying embodiment of the invention. The detail illustrated in FIG. 2 can be, for example, the detail 140 shown in FIG. 1b. The protection element 202 comprises holes provided with electrically conductive linings 213 and 214, and an electrical conductor 212 providing a galvanic connection between the electrically conductive linings 213 and 214. The circuit board 201 comprises holes provided with electrically conductive linings 217 and 218. Furthermore, there are electrically conductive pins 215 and 216 which connect the electrically conductive linings of the holes of the protection element 202 to the electrically conductive linings of the respective holes of the circuit board 201 as illustrated in FIG. 2. The electrically conductive lining 217 of the circuit board is connected to an electrical conductor 219 of the circuit board, and the electrically conductive lining 218 of the circuit board is connected to an electrical conductor 220 of the circuit board. The electrical conductor 219 is a part of a first functional entity, e.g. a power supply converter, of the circuit board system and the electrical conductor 220 is a part of a second functional entity, e.g. a signal processing part, of the circuit board system. As illustrated in FIG. 2, the protection element 202 together with the pins 215 and 216 form a galvanic connection between the electrically conductive linings 217 and 218 and thereby connect the first and second functional entities to each other.

In a circuit board system obtainable by a method according to an exemplifying embodiment of the invention, the pins 215 and 216 are press-fit "PF" pins at their both ends, and therefore the pins provide friction fits with the electrically conductive linings of the holes of the circuit board and with the electrically conductive linings of the holes of the protection element. In a circuit board system obtainable by a method according to another exemplifying embodiment of the invention, the pins 215 and 216 are soldered to the protection element 202 at their first ends, and the pins are press-fit pins at their second ends providing friction fits with the electrically conductive linings 217 and 218 of the holes of the circuit board. In a circuit board system obtainable by a method according to an exemplifying embodiment of the invention, the pins 215 and 216 are soldered to the circuit board 201 at their second ends, and the pins are press-fit pins at their first ends providing friction fits with the electrically conductive linings 213 and 214 of the holes of the protection element 202. In a circuit board system obtainable by a method according to an exemplifying embodiment of the invention, the pins 215 and 216 are soldered both to the circuit board 201 and to the protection element 202.

Figure 3A:
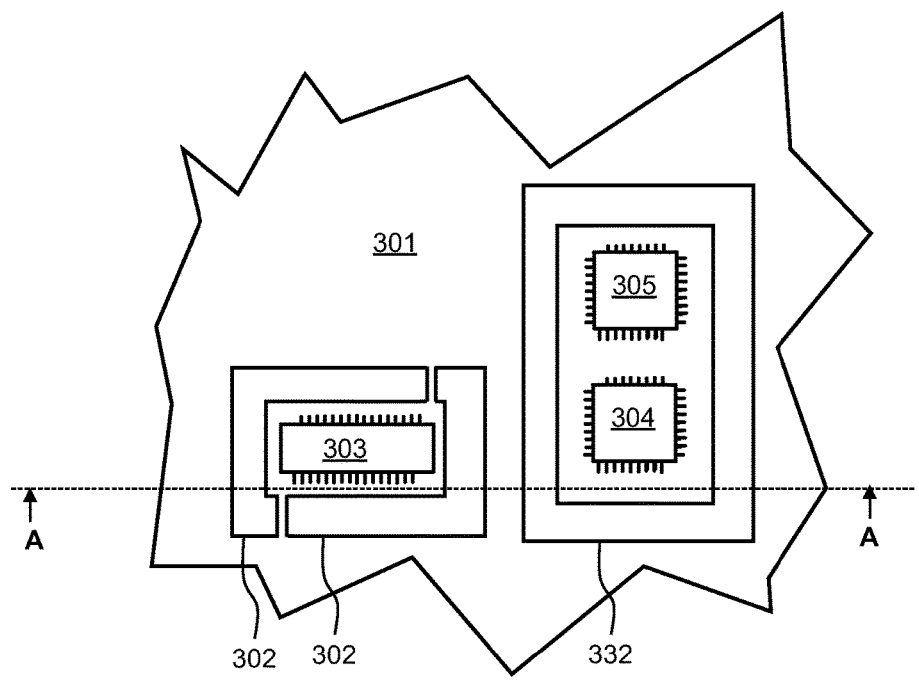
FIG. 3a illustrates a part of a circuit board system obtainable by a method according to an exemplifying embodiment of the invention.
Figure 3B:
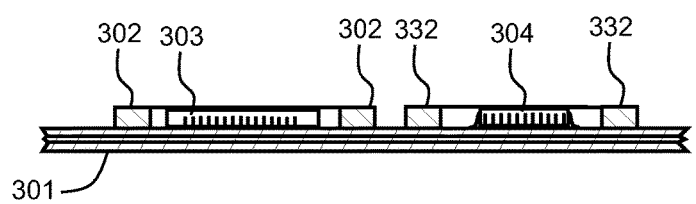

FIG. 3a illustrates a part of a circuit board system obtainable by a method according to an exemplifying embodiment of the invention. FIG. 3b shows a schematic view of a section taken along the line A-A shown in FIG. 3a. In a circuit board system obtainable by a method according to this exemplifying embodiment of the invention, there are more than one protection elements on the surface of a circuit board 301 and each of the protection elements has a loop-shaped structure surrounding at least one of the electrical components. In the exemplifying case illustrated in FIGS. 3a and 3b, a protection element 302 surrounds an electrical component 303 and a protection element 332 surrounds electrical components 304 and 305. As illustrated in FIG. 3a, the protection element 302 consists of two pieces which together form the loop-shaped structure surrounding the electrical component 303.

In a circuit board system obtainable by a method according to an exemplifying embodiment of the invention, the circuit board 301 comprise soldering pads on the surface of the circuit board, and the protection elements 302 and 332 comprise corresponding soldering pads. In this case, the protection elements are surface mounted devices "SMD" and the protection elements can be attached to the circuit board in the same SMD soldering process when electrical SMD components are attached to the circuit board. The solder joints between the soldering pads of the circuit board and the corresponding soldering pads of the protection element can be used for providing one or more galvanic connections between functional entities of the circuit board system.

In the circuit board systems illustrated in FIGS. 1a, 1b, 3a and 3b, there are one or more protection elements on only one side of the circuit board 101, 201, 301. It is to be, however, noted that it is possible to have one or more protection elements on both sides of the circuit board. Furthermore, it is to be noted that the protection elements 102 and 332 shown in FIGS. 1a, 1b, 3a and 3b may consist of multiple separate pieces each of which being attached to the surface of the circuit board.

Figure 4:
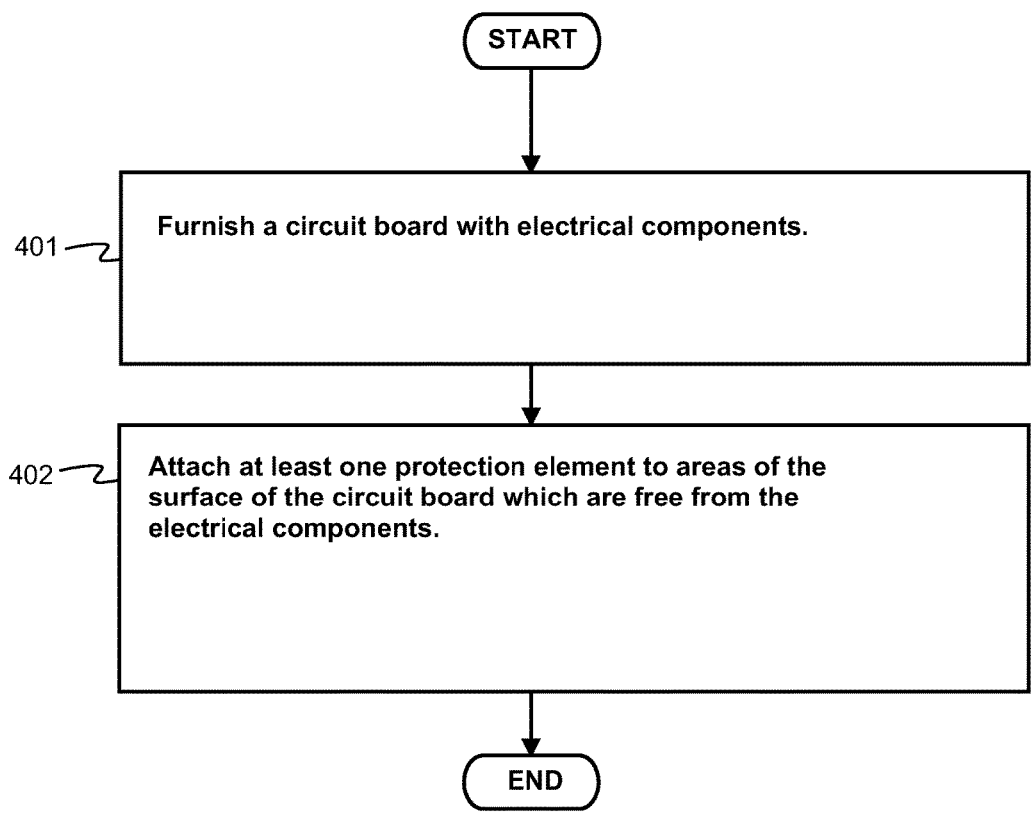
FIG. 4 shows a flowchart of a method according to an exemplifying embodiment of the invention for manufacturing a circuit board system.

FIG. 4 shows a flowchart of a method according to an exemplifying embodiment of the invention for manufacturing a circuit board system. The method comprises the following actions:
- action 401: furnishing a circuit board with electrical components, and
- action 402: attaching at least one protection element to areas of a surface of the circuit board which are free from the electrical components, the protection element having thickness in the direction perpendicular to the circuit board, wherein the protection element is shaped to leave the electrical components unscreened in the direction perpendicular to the circuit board.

In a method according to an exemplifying embodiment of the invention, a body of the protection element is made of the same material as an electrically insulating body of the circuit board so as to make the thermal expansion coefficient of the protection element to be substantially the same as that of the circuit board.

In a method according to an exemplifying embodiment of the invention, the circuit board and the at least one protection element comprise soldering pads and the at least one protection element is attached to the circuit board in the same soldering process in which electrical surface mounted device "SMD" components are attached to the circuit board.

In a method according to an exemplifying embodiment of the invention, the protection element comprises rubber so as to make the protection element flexible and thereby capable of adapting to the thermal expansion of the circuit board.

Figure 5:
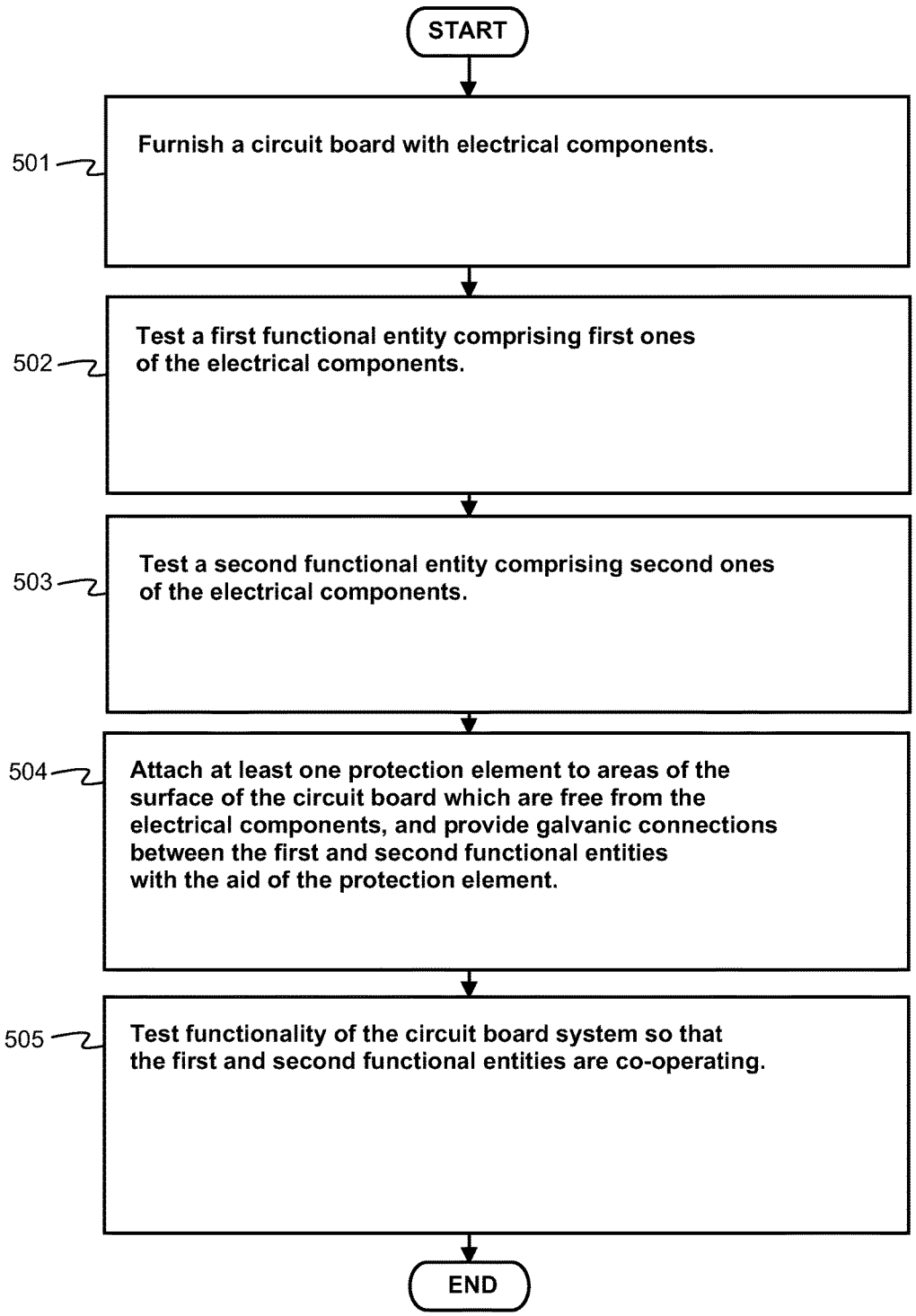
FIG. 5 shows a flowchart of a method according to an exemplifying embodiment of the invention for manufacturing a circuit board system.

FIG. 5 shows a flowchart of a method according to an exemplifying embodiment of the invention for manufacturing a circuit board system. The method comprises the following actions:
- action 501: furnishing a circuit board with electrical components,
- action 502: testing a first functional entity comprising first ones of the electrical components,
- action 503: testing a second functional entity comprising second ones of the electrical components, the first and second functional entities being tested separately from each other,
- action 504: attaching at least one protection element to areas of a surface of the circuit board which are free from the electrical components, and providing, with the aid of the protection element, at least one galvanic connection between the first and second functional entities, and
- action 505: testing functionality of the circuit board system so that the first and second functional entities are co-operating with each other via the at least one galvanic connection during the testing of the functionality.

In a method according to an exemplifying embodiment of the invention, the circuit board comprises holes lined with electrically conductive material, and the protection element comprises electrically conductive pins and an electrical conductor between the pins. The pins are pushed to the holes of the circuit board so as to provide the galvanic connection between the first and second functional entities.

In a method according to an exemplifying embodiment of the invention, the pins of the protection element are press-fit pins providing friction fits with the electrically conductive linings of the holes of the circuit board.

In a method according to an exemplifying embodiment of the invention, the pins of the protection element are soldered to the electrically conductive linings of the holes of the circuit board.

In a method according to an exemplifying embodiment of the invention, the protection element comprises holes lined with electrically conductive material and an electrical conductor between the electrically conductive linings. The circuit board comprises electrically conductive pins that are pushed to the holes of the protection element so as to provide the galvanic connection between the first and second functional entities.

In a method according to an exemplifying embodiment of the invention, the pins of the circuit board are press-fit pins providing friction fits with the electrically conductive linings of the holes of the protection element.

In a method according to an exemplifying embodiment of the invention, the pins of the circuit board are soldered to the electrically conductive linings of the holes of the protection element.

In a method according to an exemplifying embodiment of the invention, the first functional entity of the circuit board system is a power supply converter of the circuit board system and the second functional entity of the circuit board system is a signal processing part of the circuit board system The specific examples provided in the description given above should not be construed as limiting the applicability and/or the interpretation of the appended claims.

What is claimed is:

1. A method for manufacturing a circuit board system, the method comprising:
    furnishing a circuit board, with electrical components placed onto a surface of the circuit board; and
    attaching at least one protection element to areas of the surface of the circuit board which are free from the electrical components, the protection element having a thickness in a direction perpendicular to the circuit board, and a width and a length in respective directions parallel with the circuit board, the protection element being shaped to leave the electrical components unscreened in the direction perpendicular to the circuit board and the width of the protection element being greater than the thickness of the protection element,
    wherein the attaching the at least one protection element to the areas of the surface of the circuit board comprises providing, with an aid of the protection element, at least one galvanic connection between at least one of first ones of the electrical components belonging to a first functional entity of the circuit board system and at least one of second ones of the electrical components belonging to a second functional entity of the circuit board system.

2. The method according to claim 1,
wherein the circuit board and the at least one protection element comprise soldering pads, and
wherein the at least one protection element is attached to the circuit board in a same soldering process in which those of the electrical components that are surface mounted devices "SMD" are attached to the circuit board.

3. The method according to claim 1, wherein the method further comprises:
after the furnishing of the circuit board with the electrical components and prior to attaching the at least one protection element to the areas of the surface of the circuit board:
testing the first functional entity, and
testing the second functional entity, the first and second functional entities being tested separately from each other; and
after the attaching the at least one protection element to the areas of the surface of the circuit board:
testing functionality of the circuit board system so that the first and second functional entities are cooperating with each other via the at least one galvanic connection during the testing of the functionality.

4. The method according to claim 1, wherein the first functional entity of the circuit board system is a power supply converter of the circuit board system, and the second functional entity of the circuit board system is a signal processing part of the circuit board system.

* * * * *